(12) United States Patent
Guo et al.

(10) Patent No.: US 10,043,846 B2
(45) Date of Patent: Aug. 7, 2018

(54) RADIOGRAPHIC DETECTION SUBSTRATE AND MANUFACTURE METHOD THEREOF, RADIOGRAPHIC DETECTION DEVICE

(71) Applicant: BOE TECHNOLOGY GROUP CO., LTD., Beijing (CN)

(72) Inventors: Wei Guo, Beijing (CN); Xingdong Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/109,205

(22) PCT Filed: Nov. 5, 2015

(86) PCT No.: PCT/CN2015/093900
§ 371 (c)(1),
(2) Date: Jun. 30, 2016

(87) PCT Pub. No.: WO2017/000458
PCT Pub. Date: Jan. 5, 2017

(65) Prior Publication Data
US 2017/0133428 A1 May 11, 2017

(30) Foreign Application Priority Data

Jun. 29, 2015 (CN) .......................... 2015 1 0369712

(51) Int. Cl.
*H01L 27/00* (2006.01)
*H01L 27/146* (2006.01)
(Continued)

(52) U.S. Cl.
CPC ........ *H01L 27/14676* (2013.01); *G01T 1/202* (2013.01); *H01L 27/14609* (2013.01);
(Continued)

(58) Field of Classification Search
CPC . H01L 27/14658; H01L 31/115; H01L 27/308
See application file for complete search history.

(56) References Cited

U.S. PATENT DOCUMENTS 5,319,206 A * 6/1994 Lee .................. H01L 27/14676
250/370.09
5,381,014 A * 1/1995 Jeromin ............ H01L 27/14609
250/370.09
(Continued)

FOREIGN PATENT DOCUMENTS

CN 102157533 A 8/2011
CN 102881701 A 1/2013
(Continued)

OTHER PUBLICATIONS

International Search Report of PCT/CN2015/093900 in Chinese, dated Mar. 24, 2016 with English translation.
(Continued)

*Primary Examiner* — Ngan Ngo
(74) *Attorney, Agent, or Firm* — Collard & Roe, P.C.

(57) ABSTRACT

A radiographic detection substrate, a manufacture method thereof, and a radiographic detection device are provided. The radiographic detection substrate includes a substrate; and a thin film transistor and a signal storage unit which are formed on the substrate; the thin film transistor includes a gate electrode, an insulating layer, an active layer, a source electrode, a drain electrode and a passivation layer which are sequentially formed on the substrate; the signal storage unit includes a storage capacitor, the storage capacitor includes a first electrode and a second electrode, the first electrode is formed on the insulating layer and lapped with the drain electrode, the second electrode is connected to a ground line; the passivation layer is formed on the source electrode, the drain electrode, the first electrode and the ground line. The present invention efficiently decreases the number of mask- (Continued)

ing processes by at least one connection method selected from lapping the first electrode and the drain electrode, connecting the second electrode to the ground line through the first via hole, and connecting the third electrode to the first electrode via the second via hole, to simplify the manufacture process of the radiographic detection substrate and reduce the manufacture costs.

20 Claims, 5 Drawing Sheets

(51) Int. Cl.
  *H01L 27/30*  (2006.01)
  *H01L 31/08*  (2006.01)
  *H01L 31/115*  (2006.01)
  *G01T 1/202*  (2006.01)

(52) U.S. Cl.
  CPC .. *H01L 27/14612* (2013.01); *H01L 27/14636* (2013.01); *H01L 27/14658* (2013.01); *H01L 27/14672* (2013.01); *H01L 27/14689* (2013.01); *H01L 27/308* (2013.01); *H01L 31/085* (2013.01); *H01L 31/115* (2013.01)

(56) References Cited

U.S. PATENT DOCUMENTS

| | | | | |
|---|---|---|---|---|
| 5,498,880 | A * | 3/1996 | Lee | H01L 27/14676 250/370.09 |
| 5,994,157 | A * | 11/1999 | Aggas | H01L 27/14658 257/E27.131 |
| 6,020,590 | A * | 2/2000 | Aggas | H01L 27/14663 250/370.08 |
| 6,060,714 | A * | 5/2000 | Zhong | H01L 27/14676 250/214.1 |
| 6,124,606 | A * | 9/2000 | den Boer | G02F 1/136213 257/291 |
| 8,895,986 | B2 | 11/2014 | Xu et al. | |
| 9,041,111 | B2 | 5/2015 | Xie | |
| 2005/0017189 | A1* | 1/2005 | Homma | G01T 1/2018 250/370.11 |
| 2005/0118527 | A1* | 6/2005 | Harel | G01T 1/24 430/270.1 |
| 2006/0033030 | A1* | 2/2006 | Ito | G01T 1/2018 250/370.11 |
| 2006/0180768 | A1* | 8/2006 | Bogdanovich | H01L 31/115 250/370.09 |
| 2006/0180771 | A1* | 8/2006 | Jing | H01L 31/115 250/370.14 |
| 2006/0192131 | A1* | 8/2006 | Cheung | G01T 1/24 250/370.14 |
| 2008/0067324 | A1 | 3/2008 | Heiler et al. | |
| 2009/0001275 | A1* | 1/2009 | Okada | H01L 27/14658 250/370.08 |
| 2010/0272235 | A1* | 10/2010 | Takahashi | A61B 6/484 378/62 |
| 2011/0012022 | A1* | 1/2011 | Lee | H01L 27/14676 250/370.09 |
| 2011/0186742 | A1* | 8/2011 | Okada | G01T 1/24 250/370.08 |
| 2014/0353470 | A1 | 12/2014 | Kawanabe et al. | |

FOREIGN PATENT DOCUMENTS

| | | |
|---|---|---|
| CN | 103094295 A | 5/2013 |
| CN | 103579219 A | 2/2014 |

OTHER PUBLICATIONS

Notice of Transmittal of the International Search Report of PCT/CN2015/093900 in Chinese, dated Mar. 24, 2016.

Written Opinion of the International Searching Authority of PCT/CN2015/093900 in Chinese, dated Mar. 24, 2016 with English translation.

* cited by examiner sequentially forming the gate electrode, the insulating layer, the active layer, the source electrode, the drain electrode and the ground line on the substrate;

↓ forming the first electrode on the insulating layer so that the first electrode is lapped with the drain electrode;

↓ forming the passivation layer on the source electrode, the drain electrode, the first electrode and the ground line.

Fig. 5

RADIOGRAPHIC DETECTION SUBSTRATE AND MANUFACTURE METHOD THEREOF, RADIOGRAPHIC DETECTION DEVICE

CROSS REFERENCE TO RELATED APPLICATIONS

This application is the National Stage of PCT/CN2015/093900 filed on Nov. 5, 2015, which claims priority under 35 U.S.C. § 119 of Chinese Application No. 201510369712.5 filed on Jun. 29, 2015, the disclosure of which is incorporated by reference.

TECHNICAL FIELD

At least one embodiment of the present invention relates to a radiographic detection substrate, a manufacture method thereof and a radiographic detection device.

BACKGROUND

X-ray detection is widely applied in technical fields such as medical treatment, security, non-destructive detection and scientific research, and plays an important role in national interest and people's livelihood. At present, x-ray digital radiography (DR) detection technology appeared in the late 90's has become a commonly used X-ray radiography detection technology. An x-ray DR system usually utilizes a flat-panel detector in which a size of pixel unit can be smaller than 0.1 mm, and consequently obtains an image quality and resolution almost commensurate with that using photography films; furthermore, defects involved in photos from photography films can be eliminated, and image processing by using computers can be facilitated. According to a difference in electronic conversion modes, the x-ray technology can be classified into direct DR type and indirect DR type.

A flat-panel x-ray radiography detector of direct DR type includes a radiographic receiver, a command processor and a power supply. The radiographic receiver includes a scintillation crystal screen (Gd202 S or CsI), a large-scale amorphous silicon sensor array and a read circuit. As illustrated in FIG. 1, the scintillation crystal screen converts X-ray photons into visible light, then the large-scale amorphous silicon sensor array closely attached to the scintillation crystal screen converts the visible light into electrons, and then the read circuit digitizes the electrons and delivers digital signals to a computer so as to generate digital images for display.

An existing x-ray radiography detector of direct DR type is illustrated in FIG. 1, including: an electrode plate 2 connected to a power supply 1; an insulating plate 3, an amorphous silicon semiconductor layer 4, an electron blocking layer 5 and a charge collection layer 6 which are sequentially formed at a side of the electrode plate 2; and an acquisition circuit 8 disposed in an underlying layer. As illustrated in FIGS. 2 and 3, the amorphous silicon semiconductor layer 4 converts the photons of X-ray 9 passed through the electrode plate 2 and the insulating plate 3 into visible light, and converts the visible light into electrons, which are read and delivered to the acquisition circuit 8 by the electrode plate 810 (the charge collection layer in FIG. 1) and then output upon amplification. The acquisition circuit 8 includes a storage capacitor Cst 85 (a first electrode 807 and a second electrode 809), a transistor and an electrode plate 810 connected to the first electrode 807 of the storage capacitor; wherein the second electrode 809 of the storage capacitor is connected to a ground line 820; a source electrode 814 of the transistor is connected to the first electrode 807 and the electrode plate 810, and a drain electrode 824 of the transistor is connected to an amplifier.

During a manufacture process of such X-ray radiography detector of direct DR type, it needs to form a gate electrode 801, an insulating layer 802, an active layer 814, a source electrode 814, a ground line 820, a drain electrode 824, a first passivation layer 806, a first electrode 807 of storage capacitor, a second passivation layer 808, a second electrode 809 of the storage capacitor, a planarization layer 800 and an electrode plate 810 on a substrate 7; which requires ten to twelve times of masking processes. As a result, the manufacture of the existing X-ray radiography detector is complicated with frequent usage of masks and relatively higher cost.

SUMMARY

In one aspect, embodiments of the present invention provide a radiographic detection substrate, including: a substrate; and a thin film transistor and a signal storage unit which are formed on the substrate. The thin film transistor includes a gate electrode, an insulating layer, an active layer, a source electrode, a drain electrode and a passivation layer. The signal storage unit includes a storage capacitor, and the storage capacitor includes a first electrode and a second electrode, the first electrode is formed on the insulating layer and lapped with the drain electrode, the second electrode is connected to a ground line. The passivation layer is formed on the source electrode, the drain electrode, the first electrode and the ground line.

In an exemplary example, the first electrode is made of a transparent conductive material.

In an exemplary example, the second electrode is made of a transparent conductive material.

In an exemplary example, the passivation layer is provided with a first via hole at least partly exposing the ground line, and the second electrode is connected to the ground line through the first via hole.

In an exemplary example, the radiographic detection substrate further includes a planarization layer formed on the passivation layer and a third electrode formed on the planarization layer.

In an exemplary example, the planarization layer and the passivation layer are provided with a second via hole at least partly exposing the first electrode, and the third electrode is connected to the first electrode through the second via hole.

In an exemplary example, the ground line, the source electrode and the drain electrode are made of a same material in a same process.

In another aspect, embodiments of the present invention provide a radiographic detection device including the radiographic detection substrate according to any one of the above exemplary examples.

In yet another aspect, embodiments of the present invention disclose a manufacture method of radiographic detection substrate. The radiographic detection substrate includes: a substrate; and a thin film transistor and a signal storage unit which are formed on the substrate. The thin film transistor includes a gate electrode, an insulating layer, an active layer, a source electrode, a drain electrode and a passivation layer; the signal storage unit includes a storage capacitor, and the storage capacitor includes a first electrode. The manufacture method includes steps of: sequentially forming the gate electrode, the insulating layer, the active layer, the source electrode, the drain electrode and the ground line on the substrate; forming the first electrode on the insulating layer to be lapped with the first electrode and the drain electrode; and forming the passivation layer on the source electrode, the drain electrode, the first electrode and the ground line.

In an exemplary example, the source electrode, the drain electrode and the ground line are made of a same material in a same process.

In an exemplary example, the storage capacitor further includes a second electrode, and the method further includes: forming a first via hole at least partly exposing the ground line in the passivation layer; and forming a second electrode on the passivation layer and the first via hole so that the second electrode is contacted with the ground line through the first via hole.

In an exemplary example, the method further includes steps of forming a planarization layer and a third electrode on the passivation layer sequentially.

In an exemplary example, forming a third electrode includes: forming a second via hole at least partly exposing the first electrode in the planarization layer and the passivation layer; and forming the third electrode on the planarization layer and the second via hole so that the third electrode is contacted with the first electrode through the second via hole.

The radiographic detection substrate, the manufacture method thereof and the radiographic detection device provided by the embodiments of the present invention efficiently decrease the number of times of masking processes through at least one connection method selected from lapping the first electrode and the drain electrode, connecting the second electrode to the ground line through the first via hole, and connecting the third electrode to the first electrode via the second via hole, so as to simplify the manufacture process of the radiographic detection substrate and reduce the manufacture costs.

BRIEF DESCRIPTION OF THE DRAWINGS

Hereafter, the embodiments of the present invention will be described in detail with reference to the drawings, so as to make one person skilled in the art understand the present invention more clearly.

FIG. 5 is a flow chart illustrating a manufacture method of radiographic detection substrate provided by embodiments of the present invention.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is to be understood that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not intended to define a physical connection or mechanical connection, but may include an electrical connection/coupling, directly or indirectly. The terms, "on," "under," "left," "right," or the like are only used to indicate relative position relationship, and when the position of the object which is described is changed, the relative position relationship may be changed accordingly.

Figure 1:
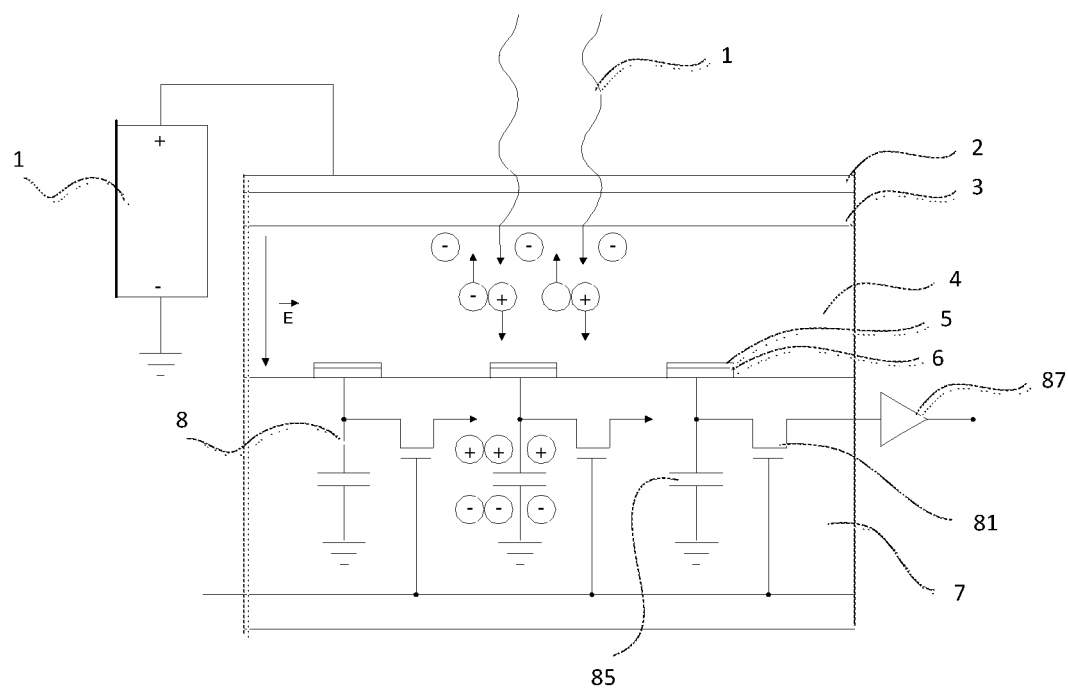
FIG. 1 is a schematic diagram illustrating a currently known X-ray detector.
Figure 2:
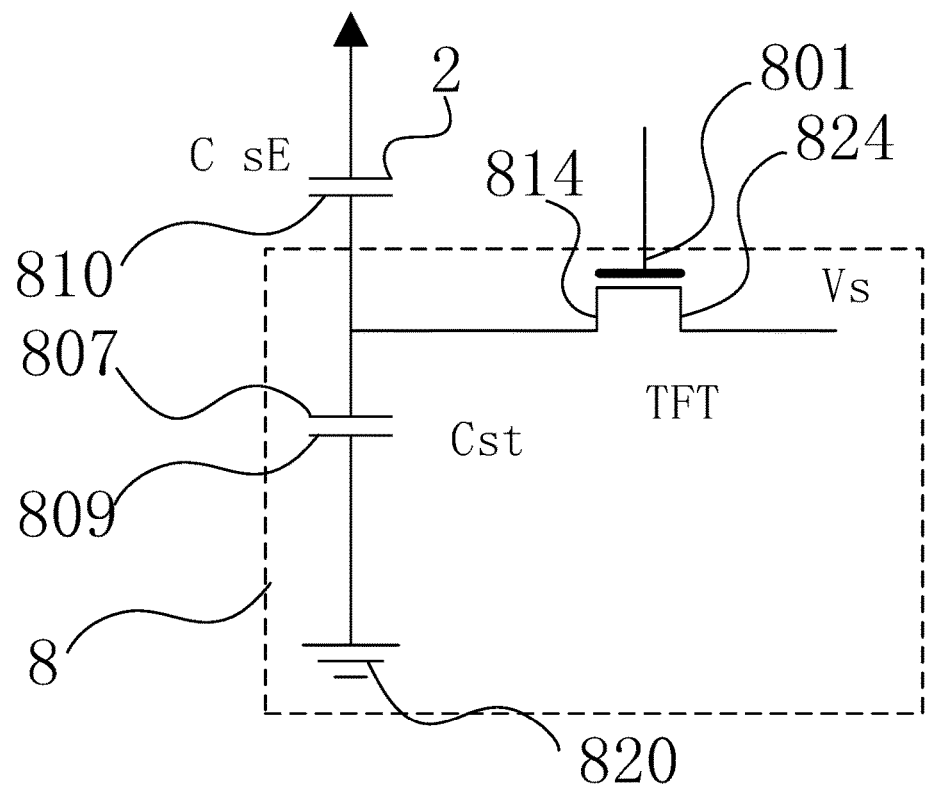
FIG. 2 is an equivalent circuit diagram illustrating a currently known X-ray detector.
Figure 3:
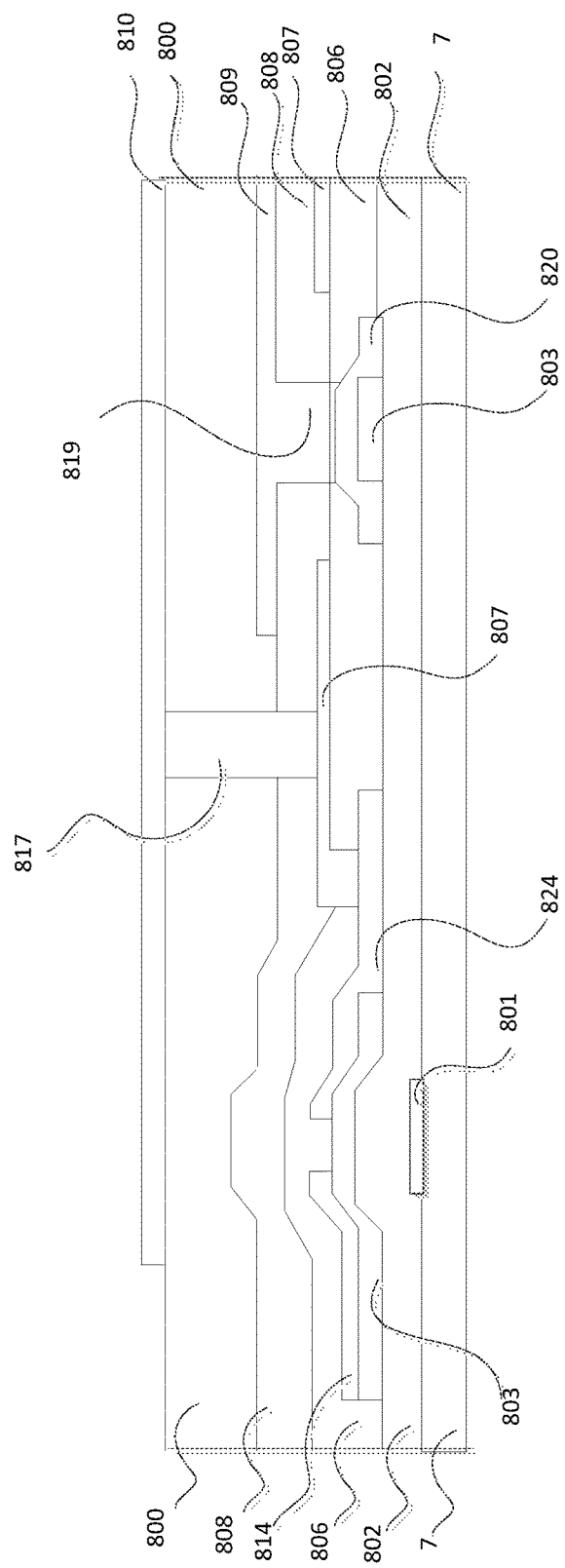
FIG. 3 is a schematically structural diagram illustrating a currently known X-ray detection substrate.
Figure 4:
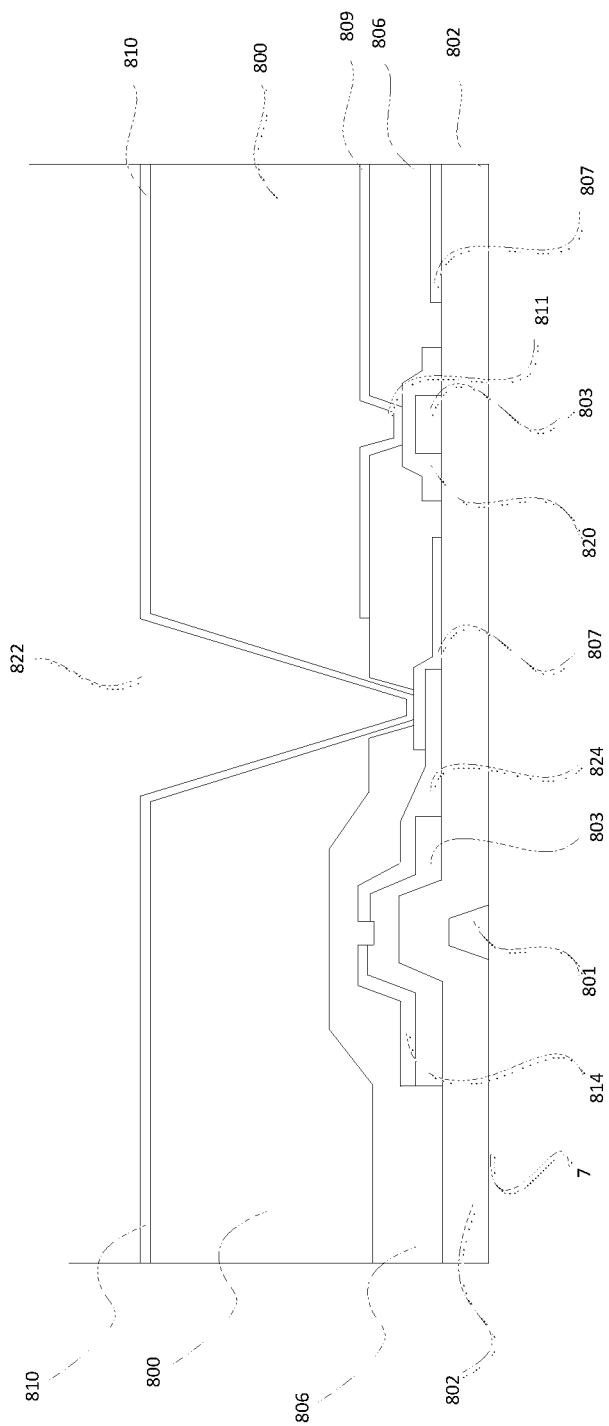
FIG. 4 is a schematically structural diagram illustrating a radiographic detection substrate provided by embodiments of the present invention.

As illustrated in FIG. 4, embodiments of the present invention provide a radiographic detection substrate, including: a substrate 7; and a thin film transistor and a signal storage unit which are formed on the substrate 7; the thin film transistor includes a gate electrode 801, an insulating layer 802, an active layer 803, a source electrode 814, a drain electrode 824 and a passivation layer 806 which are formed on the substrate 7 sequentially; the signal storage unit includes a storage capacitor, a first electrode 807 of the storage capacitor is formed on the insulating layer 802 and lapped with the drain electrode 824; a second electrode 809 of the storage capacitor 805 is connected to a ground line 820; the passivation layer 806 is formed on the source electrode 814, the drain electrode 824, the first electrode 807 and the ground line 820. In the technical solution of the embodiments of the present invention, the first electrode 807 is directly formed on the insulating layer 802, and lapped with the drain electrode 824, so as to prevent the first electrode 807 from being disposed between two passivation layers by incorporating currently used two passivation layers into a single passivation layer 806, which also omits a masking process of separately forming a via hole. It shall be understood that, the first electrode 807 is merely illustrated as two separate portions in the sectional view of FIG. 4, it is actually consisted of two portions connected integrally; also, the ground line 820 in FIG. 4 can be moved to the right so that the first electrode 807 is illustrated as an integral body in the sectional view.

The radiographic detection substrate provided by embodiments of the present invention not only can be applied for X-ray radiographic detection, but also is adapted for detection using other types of rays with substantively the same components and functions of the radiographic detection substrates as disclosed herein. Hereafter, the radiographic detection substrate provided by embodiments of the present invention is described in details with reference to X-ray radiographic detection substrate by way of example.

As illustrated in FIG. 4, in the radiographic detection substrate provided by the embodiments of the present invention, the first electrode 807 and the second electrode 809 of the storage capacitor, for example, can be transparent conductive thin films made of a material of indium tin oxide or indium zinc oxide, for example. Certainly, it shall be understood that the present invention is not limited to those disclosed herein. For example, the second electrode 809 can be made of metal or other non-transparent conductive materials.

The first electrode 807 is lapped on the drain electrode 824, thus in order to prevent etching liquid used for forming the first electrode 807 from etching and removing the source electrode 814 and the drain electrode 824 under the first electrode 807, in an exemplary example, the material of the first electrode 807 is selected such that the etching liquid used with regard to the first electrode 807 will not etch and remove the source electrode 814 and the drain electrode 824 upon etching the first electrode 807. For example, generally, the etching liquid used with regard to the transparent conductive thin film made of indium tin oxide or indium zinc oxide will not etch and remove the source electrode 814 and the drain electrode 824 made of metal materials.

In an exemplary example, as illustrated in FIG. 4, the ground line 820, the source electrode 814 and the drain electrode 824 of the radiographic detection substrate are made of a same material in a same process. Duo to such arrangement, an additional masking process of individually forming a ground line can be omitted.

In an exemplary example, as illustrated in FIG. 4, at a position corresponding to the ground line 820, the passivation layer 806 is provided with a first via hole 811 at least partly exposing the ground line 820; the second electrode 809 of the storage capacitor is connected to the ground line 820 through the first via hole. Therefore, the present exemplary example directly forms the first via hole 811 in the passivation layer 806 to be connected to the ground line, which simplifies the manufacture processes.

In an exemplary example, as illustrated in FIGS. 4 and 5, in order to further smooth a surface of the radiographic detection substrate, a surface of the passivation layer 806 as formed can be leveled up and the first via hole 811 resulted from forming the second electrode can be filled. Therefore, the radiographic detection substrate provided by the embodiments of the present invention can further comprise a planarization layer 800 formed on the passivation layer 806.

In an exemplary example, as illustrated in FIGS. 4 and 5, the passivation layer 806 is further provided with a third electrode 810 configured to acquire electrical charges, and the third electrode 810 is formed on the planarization layer 800; furthermore, in an exemplary example, in order to reduce the manufacture processes as far as possible, during forming the third electrode 810, at a position corresponding to the first electrode 807, the planarization layer 800 and the passivation layer 806 are provided with a second via hole 822 at least partly exposing the first electrode 807, wherein the third electrode 810 is connected to the first electrode 807 through the second via hole 822. In this way, a masking process can be omitted so as to further simplify the manufacture process. In an exemplary example, the planarization layer 800 can be made of resin so as to form a resin layer.

In order to further embody the advantages of the radiographic detection substrate provided by the embodiments of the present invention, the embodiments of the present invention further provide a radiographic detection device including the radiographic detection substrate according to any one of the abovementioned exemplary examples. For structures and configurations of the radiographic detection device, reference can be made to related descriptions in any one of the abovementioned exemplary examples. It shall be understood that, in addition to the radiographic detection substrate provided by the embodiments of the present invention, structures and configurations of other components in the radiographic detection device are well known in the present field and will be omitted with details herein.

In order to further embody the advantages of the radiographic detection substrate provided by the embodiments of the present invention, a manufacture method of the radiographic detection substrate is provided. The radiographic detection substrate includes a substrate 7; and a thin film transistor and a signal storage unit which are formed on the substrate, wherein the thin film transistor includes a gate electrode 801, an insulating layer 802, an active layer 803, a source electrode 814, a drain electrode 824 and a passivation layer 806 which are formed on the substrate 7 sequentially; the signal storage unit includes a storage capacitor, and the storage capacitor includes a first electrode.

As illustrated in FIG. 5, the manufacture method of radiographic detection substrate provided by the embodiments of the present invention includes steps of: sequentially forming a gate electrode 801, an insulating layer 802, an active layer 803, a source electrode 814, a drain electrode 824 and a ground line 820 on a substrate 7; forming a first electrode 807 on the insulating layer 802 to be lapped with the first electrode 807 and the drain electrode 824; and forming a passivation layer 806 on the source electrode 814, the drain electrode 824, the first electrode 807 and the ground line 820.

In an exemplary example, the first electrode 807 is directly formed on the insulating layer 802 and lapped with the drain electrode 824, so as to prevent the first electrode 807 from being disposed between two passivation layers, and eliminate the need of forming a via hole in the passivation layer 806 to be connected to the drain electrode 824. In this way, the currently used two passivation layers can be incorporated into a single passivation layer 806, which eliminates a masking process of individually forming the via hole.

Hereafter, the manufacture method of radiographic detection substrate provided by the embodiments of the present invention will be described in more details.

In an exemplary example, forming the ground line 820 at the same time when forming the source electrode 814 and drain electrode 824 by using a same material. With such arrangement, a masking process of separately forming the ground line 820 can be omitted.

In an exemplary example, the storage capacitor of the radiographic detection substrate further includes a second electrode 809; correspondingly, the manufacture method of radiographic detection substrate further includes a step of forming a second electrode 809. For example, at a position corresponding to the ground line 820, forming a first via hole 811 at least partly exposing the ground line 820 in the passivation layer 806, and forming a second electrode 809 contacted with the ground line 820 on the passivation layer 806 and the first via hole 811. In this way, the present exemplary example simplifies the manufacture process by directly forming the first via hole 811 in the passivation layer 806 to be connected to the ground line 820.

In an exemplary example, in order to further smooth a surface of the radiographic detection substrate, a surface of the passivation layer 906 can be leveled up and the first via hole 811 resulted from forming the second electrode 809 can be filled. Correspondingly, the manufacture method of radiographic detection substrate provided by the embodiments of the present invention further includes a step of sequentially forming a planarization layer 800 and a third electrode 810 on the passivation layer 806. For example, the step of forming the third electrode 810 can comprise: forming a second via hole 822 at least partly exposing the first electrode 807 in the planarization layer 800 and the passivation layer 806 at a position corresponding to the first electrode 807; and forming a third electrode 810 on the planarization layer 800 and the second via hole 822 so that the third electrode 810 is contacted with the first electrode 807. In an exemplary example, the planarization layer 800 can be made of resin so as to form a resin layer.

To sum up, the radiographic detection substrate, the manufacture method thereof and the radiographic detection device provided by the embodiments of the present invention efficiently decrease the number of times of masking processes through at least one connection method selected from lapping the first electrode and the drain electrode, connecting the second electrode to the ground line through the first via hole, and connecting the third electrode to the first electrode via the second via hole, so as to simplify the manufacture process of the radiographic detection substrate and also reduce the manufacture costs thereof.

The foregoing are merely specific embodiments of the invention, but not limitative to the protection scope of the invention. Within the technical scope disclosed by the present invention, any alternations or replacements which can be readily envisaged by one skilled in the art shall be within the protection scope of the present invention. Therefore, the protection scope of the invention shall be defined by the accompanying claims.

The present invention claims the benefits of Chinese patent application No. 201510369712.5, which was filed with the SIPO on Jun. 29, 2015 and is fully incorporated herein by reference as part of this application.

What is claimed is:

1. A radiographic detection substrate, comprising:
a substrate; and
a thin film transistor and a signal storage unit that are formed on the substrate,
wherein the thin film transistor comprises a gate electrode, an insulating layer, an active layer, a source electrode, a drain electrode and a passivation layer;
the signal storage unit comprises a storage capacitor, and the storage capacitor comprises a first electrode and a second electrode, the first electrode is directly formed on the insulating layer and lapped with the drain electrode;
the passivation layer is formed on the source electrode, the drain electrode and the first electrode; and
the second electrode is formed on the passivation layer and is connected to a ground line below the passivation layer.

2. The radiographic detection substrate according to claim 1, wherein the first electrode is made of a transparent conductive material.

3. The radiographic detection substrate according to claim 1, wherein the second electrode is made of a transparent conductive material.

4. The radiographic detection substrate according to claim 1, wherein the passivation layer is provided with a first via hole at least partly exposing the ground line, and the second electrode is connected to the ground line through the first via hole.

5. The radiographic detection substrate according to claim 1, further comprising a planarization layer formed on the passivation layer and a third electrode formed on the planarization layer.

6. The radiographic detection substrate according to claim 5, wherein the planarization layer and the passivation layer are provided with a second via hole at least partly exposing the first electrode, and the third electrode is connected to the first electrode through the second via hole.

7. The radiographic detection substrate according to claim 1, wherein the ground line, the source electrode and the drain electrode are made of a same material in a same process.

8. A radiographic detection device comprising the radiographic detection substrate according to claim 1.

9. A manufacture method of radiographic detection substrate, wherein the radiographic detection substrate comprises: a substrate; and a thin film transistor and a signal storage unit which are formed on the substrate;
the thin film transistor comprises a gate electrode, an insulating layer, an active layer, a source electrode, a drain electrode and a passivation layer; and
the signal storage unit comprises a storage capacitor, the storage capacitor comprises a first electrode and a second electrode,
the manufacture method comprises:
sequentially forming the gate electrode, the insulating layer, the active layer, the source electrode, the drain electrode and the ground line on the substrate;
forming the first electrode on the insulating layer so that the first electrode is lapped with the drain electrode;
forming the passivation layer on the source electrode, the drain electrode, the first electrode and the ground line; and
forming the second electrode on the passivation layer.

10. The manufacture method according to claim 9, wherein the source electrode, the drain electrode and the ground line are made of a same material in a same process.

11. The manufacture method according to claim 9, wherein forming the second electrode on the passivation layer comprises:
forming a first via hole at least partly exposing the ground line in the passivation layer; and
forming the second electrode on the passivation layer and the first via hole so that the second electrode is contacted with the ground line through the first via hole.

12. The manufacture method according to claim 9, further comprising:
sequentially forming a planarization layer and a third electrode on the passivation layer.

13. The manufacture method according to claim 12, wherein forming the third electrode comprises:
forming a second via hole at least partly exposing the first electrode in the planarization layer and the passivation layer; and
forming the third electrode on the planarization layer and the second via hole so that the third electrode is contacted with the first electrode through the second via hole.

14. The radiographic detection substrate according to claim 2, wherein the passivation layer is provided with a first via hole at least partly exposing the ground line, and the second electrode is connected to the ground line through the first via hole.

15. The radiographic detection substrate according to claim 3, wherein the passivation layer is provided with a first via hole at least partly exposing the ground line, and the second electrode is connected to the ground line through the first via hole.

16. The radiographic detection substrate according to claim 2, further comprising a planarization layer formed on the passivation layer and a third electrode formed on the planarization layer.

17. The radiographic detection substrate according to claim 3, further comprising a planarization layer formed on the passivation layer and a third electrode formed on the planarization layer.

18. The manufacture method according to claim 10, further comprising:
   sequentially forming a planarization layer and a third electrode on the passivation layer.

19. The manufacture method according to claim 11, further comprising:
   sequentially forming a planarization layer and a third electrode on the passivation layer.

20. The manufacture method according to claim 18, wherein forming the third electrode comprises:
   forming a second via hole at least partly exposing the first electrode in the planarization layer and the passivation layer; and
   forming the third electrode on the planarization layer and the second via hole so that the third electrode is contacted with the first electrode through the second via hole.

* * * * *